United States Patent [19]

Kubena et al.

[11] Patent Number: 5,501,822
[45] Date of Patent: Mar. 26, 1996

[54] FABRICATION METHOD FOR A 3-D OPTO-ELECTRONIC SYSTEM WITH LASER INTER-SUBSTRATE COMMUNICATION

[75] Inventors: Randy L. Kubena, Agoura; Frederic P. Stratton, El Segundo; Gary M. Atkinson, Santa Monica; Hugh McNulty, Jr., Santa Monica; James W. Ward, Canoga Park, all of Calif.

[73] Assignee: Hughes Aircraft Company, Los Angeles, Calif.

[21] Appl. No.: 238,131

[22] Filed: May 5, 1994

Related U.S. Application Data

[62] Division of Ser. No. 971,383, Nov. 4, 1992, Pat. No. 5,335,243.
[51] Int. Cl.$^6$ .................................................. B29D 11/00
[52] U.S. Cl. ........................ 264/1.37; 264/1.9; 264/400; 425/174.4
[58] Field of Search ................................ 264/1.36, 1.37, 264/1.38, 22, 25, 1.9; 475/174, 174.4

[56] References Cited

U.S. PATENT DOCUMENTS

| | | | |
|---|---|---|---|
| 4,307,046 | 12/1981 | Neefe | 264/1.37 |
| 4,563,565 | 1/1986 | Kampfer et al. | 264/1.37 |
| 4,642,439 | 2/1987 | Miller et al. | 264/1.37 |
| 4,935,939 | 6/1990 | Liau et al. | 372/101 |
| 5,053,171 | 10/1991 | Portney et al. | 264/1.37 |
| 5,294,293 | 3/1994 | Jones | 264/1.37 |

FOREIGN PATENT DOCUMENTS 291459  11/1988  European Pat. Off. ............. 264/1.37

OTHER PUBLICATIONS

Wakabayasaki, "In GaAsP/InP Horizontal Cavity Surface-Emitting Lasers Radiating in two opposite directions", App. Phys. Ltrs, vol. 61, No. 13, Sep. 1992, pp. 1499–1501.
Liau, "Low Threshold GaInAsP/InP Buried Hetero-Structure Laser with a Chemically Etched and Mass-Transported Mirror", App. Phys. Ltrs., vol. 44, No. 10, May, 1984, pp. 945–947.
Harriott, et al, "Micromachining of Optical Structures with Focused Ion Beams", J Vac. Sci Techn., vol. B5, No. 1, Jan./Feb. 1987, pp. 207–210.
Tell, et al, "High Power CW Vertical Cavity Top Surface Emitting GaAs Quantum Well Lasers", App. Phys. Ltrs., vol. 57, No. 18, Oct. 1990, pp. 1855–1857.
Itaya, et al, "New 1.5 Micron Wavelength GaInAsP/InP Distributed Feedback Laser", Elect. Ltrs., vol. 18, No. 23, 1982, pp. 1006–1007.
P. D. Maker, et al, "Phase Holograms in PMMA", J Vac. Sci. and Tech., vol. B10, Nov./Dec. 1992, pres. at EIPB 92 Symposium, Orlando, May, 1992.

Primary Examiner—Mathieu D. Vargot
Attorney, Agent, or Firm—Vijayalakshmi D. Duraiswamy; Wanda K. Denson-Low

[57] ABSTRACT

A 3-dimensional opto-electronic system employs an optical communications channel between spaced circuit substrates. The beam from an in-line laser on one substrate is deflected by a turning mirror that is monolithically integrated on the substrate along with the laser and its associated electronic circuitry, and directed to an optical detector on another substrate. The deflection is accomplished with a turning mirror that is specially fabricated with a focused ion beam (FIB) so that it focuses or collimates as well as deflects the laser beam onto the photodetector. The mirror is initially formed with a flat surface, and is thereafter processed with the FIB to produce focusing curvatures in both x and y directions. The mirror is preferably spaced away from the laser, and is illuminated over substantially the full laser height to maximize its focal length for a given reflected spot size. For a rectangular laser beam, the mirror curvature can be different along the mirror width than along its height to produce a smaller, more rounded spot. The mirror curvature is preferably established by raster scanning the mirror area in multiple series of FIB scans, with each series encompassing a different proportion of the mirror surface, and repeating each series a number of times that generally increases with its area. The area-dependent repetition pattern is preferably followed for two sets of scans, one with the scanning area's x dimension progressively reduced and the other with its y dimension progressively reduced.

9 Claims, 3 Drawing Sheets

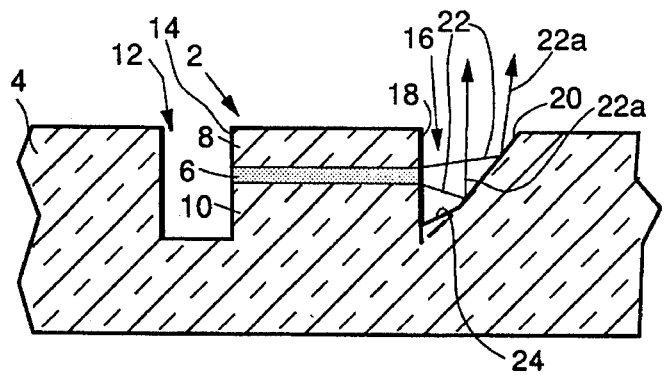
FIG. 1.
(PRIOR ART)
FIG. 2.
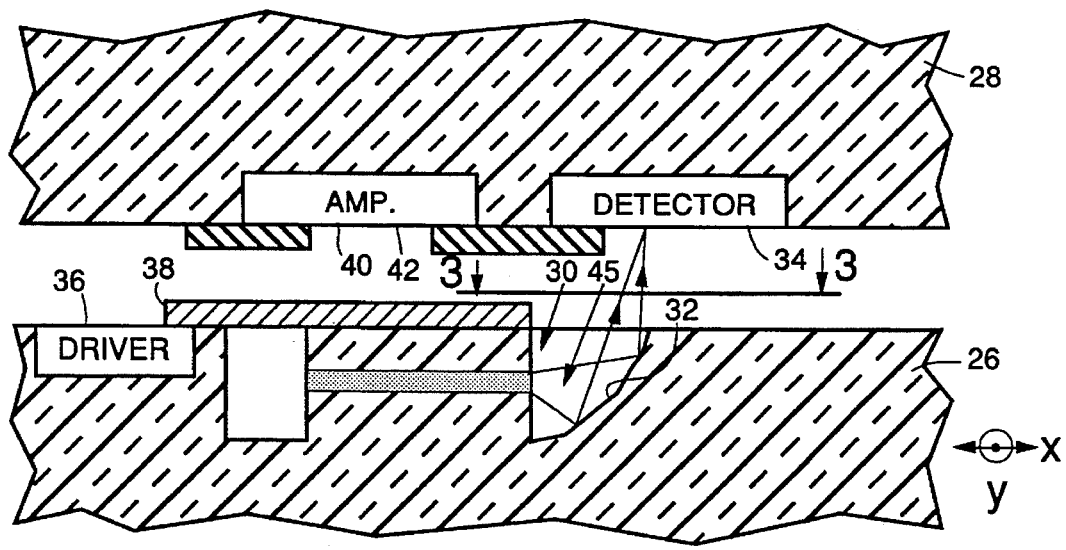
FIG. 3.
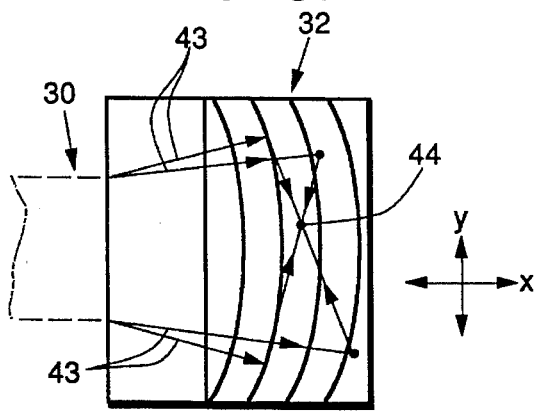

FABRICATION METHOD FOR A 3-D OPTO-ELECTRONIC SYSTEM WITH LASER INTER-SUBSTRATE COMMUNICATION

This is a division of application Ser. No. 07/971,383, filed Nov. 4, 1992, now U.S. Pat. No. 5,335,243.

BACKGROUND OF THE INVENTION

1. Field of the Invention

This invention relates to laser systems and associated fabrication methods for directing a laser beam away from a substrate, and more particularly to laser systems that can be monolithically integrated with electronic circuitry on the same substrate to optically communicate with adjacent substrates.

2. Description of the Related Art

Ultra-high speed interconnect links between integrated circuit (IC) chips and data buses will be needed for contemplated 3-dimensional opto-electronic systems. Currently available electronic systems incorporate optical isolation and optical data parts between larger subsystems, but the optical elements are discrete. A more compact, less expensive and more reliable system would result if the optical elements could be monolithically integrated on the same chip substrates as the electronic circuitry.

There are three known approaches to achieving out-of-plane laser emission for potential optical interconnect applications. The first is the use of vertical cavity lasers, in which the laser beam is initially emitted vertically upward and away from the substrate upon which the laser is formed. This type of laser is described in Tell et al., "High-power cw vertical-cavity top surface-emitting GaAs quantum well lasers", *Applied Physics Letters*, Vol. 7, No. 18, Oct. 29, 1990, pages 1855–1857. They are fabricated by reactive ion etching (RIE), using epitaxially grown Bragg reflectors for mirrors. However, despite rapid progress in the development of GaAs/AlGaAs and GaInAs/GaAs vertical cavity surface emitting lasers (SELs) in recent years, such lasers exhibit poor efficiency and are subject to significant diffraction problems. Also, the development of InGaAsP/InP vertical cavity SELs has been hampered by the difficulty of realizing high reflectivity semiconductor quarter-wavelength Bragg mirrors, due to the low index of refraction modulation in such mirrors.

The second technique for out-of-plane laser emission involves the fabrication of a periodic grating on the laser's upper cladding layer to couple light vertically out of the laser plane. For example, see Itaya et al., "New 1.5 Micron Wavelength GaInAsP/InP Distributed Feedback Laser", *Electronics Letters*, Vol. 18, No. 23, 1982, pages 1006–1007. Unfortunately, Bragg reflectors of this type suffer from inherent inefficiency, since it is difficult to couple a high percentage of the gain out into the vertical direction. In addition, although they satisfy the Bragg condition, extraneous orders of propagation do not deflect their output in the required direction, and therefore a rather broad spatial distribution is typically obtained.

A third approach is to use in-plane SELs, in which a laser beam is initially generated along an axis parallel to the substrate, and then deflect the beam off a turning mirror so that it travels away from the substrate. Such a system is illustrated in FIG. 1. A laser 2 extends upward from a semiconductor substrate 4, with an active lasing region 6 sandwiched between semiconductor cladding layers 8 and 10; the body of the substrate can itself serve as the lower cladding layer. A trench 12 is formed behind the laser to allow a fully reflective mirror 14 to be coated over its rear surface, while an angled trench 16 is formed immediately in front of the laser to permit the deposition of a partially reflective mirror 18 over the front end of the laser. The trench wall 20, which establishes the opposite side of the trench from the laser, is formed at an angle that causes at least part of the emitted laser beam 22 to be deflected generally perpendicular to the substrate. Since the laser beam 22 expands in the vertical direction as seen in FIG. 1 (it also expands laterally into and out of the page), the reflected beam 22a is similarly divergent.

Three different fabrication techniques have been used to form this type of turning mirror. They involve angled flood ion beam etching (see, e.g., Wakabayaski, "In GaAsP/InP horizontal cavity surface-emitting lasers radiating in two opposite directions", *Applied Physics Letters*, Vol. 61, No. 13, Sept. 28, 1992, pages 1499–1501); mass transport (see, e.g., Liau, "Low threshold GaInAsP/InP buried-heterostructure lasers with a chemically etched and mass-transported mirror", *Applied Physics Letters*, Vol. 44, No. 10, May 15, 1984, pages 945–947); and selective laser or electron-beam resist exposure coupled with ion milling (see, e.g., P. D. Maker et al., "Phase Holograms in PMMA", *Journal of Vacuum Science and Technology*, Vol. B10, November–December 1992, presented at EIPB 92 Symposium, Orlando, Fla., May 1992). Each of these techniques, however, is less than optimum in terms of flexibility, simplicity and precise 3-dimensional beam directional control. With resist masking and angled ion beam etching, for example, curved surfaces in only one dimension have been achieved. In addition, different curvatures and turning angles cannot be achieved on different devices without remasking steps. Multiple resist masking steps and mass transport suffer from process complexity, high fabrication temperatures that are beyond the temperature limits of electronic circuitry that might otherwise be placed on the same substrate, and a poor control over the final optical profile and beam angle. Resist "holography" and ion beam etching also suffer from process complexity and a lack of precise control over the final optical profile, due mainly to proximity effects, laser resolution, resist development characteristics, ion etching nonuniformities through resist masks, and resist-to-substrate etch rate differences.

A focused ion beam (FIB) has also previously been used to form a flat turning mirror. See, e.g., Harriott et al., "Micromachining of optical structures with focused ion beams", *Journal of Vacuum Science Technology*, Vol. B5, No. 1, January/February 1987, pages 207–210. The ion beam is raster scanned across the substrate immediately adjacent to the output end of the laser, with the number of scans linearly decreasing as the distance from the laser increases, to form the angled wall 20. In practice, this does not result in a precisely flat turning mirror, since a residue 24 of redeposited substrate material is built up towards the bottom of the laser. However, since the mirror 20 is formed immediately adjacent the laser, the emitted beam 22 strikes only the central flat portion of the mirror, and the residue 24 does not significantly affect the beam's reflection.

The use of a turning mirror with an in-line (parallel to substrate) laser has thus far not been practical for use as an inter-substrate optical link in an integrated 3-D, multi-chip opto-electronic system. In such a system it would be highly desirable that an optical detector on one substrate, used to detect an optical transmission from another substrate, be as small as possible. This saves chip area, and perhaps more importantly reduces capacitance effects associated with larger detectors. Such capacitance effects slow the detector's speed of response, and make it unsuitable for high speed or large bandwidth operations. In addition to the fact that the existing turning mirrors deflect the laser beam as a divergent beam, thus increasing the required detector dimension, the beam is emitted from the laser over a rectangular emission area that is much wider than it is high. Thus, in FIG. 1 the laser beam will actually have a considerably greater dimension into the page than its vertical height when initially emitted. This lateral beam dimension also diverges, and greatly adds to the required detector dimension.

SUMMARY OF THE INVENTION

The present invention seeks to provide a turning mirror for an in-line laser that can be monolithically integrated on the same substrate with the laser and associated circuitry, and that is highly compatible with 3-D optoelectronic systems.

These goals are realized with a turning mirror that has a 3-dimensional curvature to both deflect and focus the beam from the in-line laser. The mirror is initially formed with a flat surface, after which a focused ion beam (FIB) is raster scanned over the flat surface to obtain the desired curvature. The initial flat mirror surface can also be formed with the FIB in an integrated fabrication process.

To obtain a relatively long focal length for a given focus laser spot size and reduce diffraction effects, the mirror can be spaced away from the laser and its curvature made to extend over substantially the full laser height, thereby allowing the beam to expand over a layer mirror surface. In this case, if a FIB is used to form the initial flat mirror surface, the FIB dose is increased towards the bottom of the mirror in greater than unity proportion to compensate for a redeposited residue that tends to accumulate in this area. When used with a conventional IC laser that emits a rectangular beam having a much greater width than height dimension, the mirror focal length can be made different for the width dimension than for the height dimension to produce a more rounded laser spot at a detector plane in the near field. Alternatively, the focal points in the x and y axes can be adjusted to both equal the distance between the mirror and the emitting laser facet, so as to produce more collimated light in both axes.

The FIB raster scanning that is used to produce the mirror curvature is preferably conducted in multiple series of raster scans, with each series encompassing a different proportion of the total mirror surface, and with each series being repeated a number of times that generally increases with the area which it covers. With the scanning conducted along generally orthogonal x-y axes, one set of scan series is characterized by a substantially constant y-dimension and a progressively reduced x-dimension, while another set of scan series is characterized by a substantially constant x-dimension and a progressively reduced y-dimension.

The use of a FIB to form the mirror makes possible a low temperature, maskless process that can be computer controlled and gives a high resolution curvature. It allows arbitrary geometries and arbitrary angles to be fabricated in a single in situ process.

The invention also contemplates a 3-D opto-electronic system in which an optical detector on one circuit substrate receives a focused laser beam from an in-line laser on another circuit substrate, with the described turning/focusing mirror directing the beam onto the detector. The invention allows for both the use of a small optical detector, and an optimized spacing between the circuit substrates.

These and other features and advantages of the invention will be apparent to those skilled in the art form the following detailed description, taken together with the accompanying drawings.

BRIEF DESCRIPTION OF THE DRAWINGS

FIG. 1 is a sectional view of a conventional monolithically integrated laser-turning mirror structure, described above;

FIG. 2 is a sectional view of a 3-D opto-electronic system in accordance with the invention;

FIG. 3 is a plan view of a turning mirror in accordance with the invention, take along the line 3—3 of FIG. 2;

DETAILED DESCRIPTION OF THE INVENTION

Figure 4:
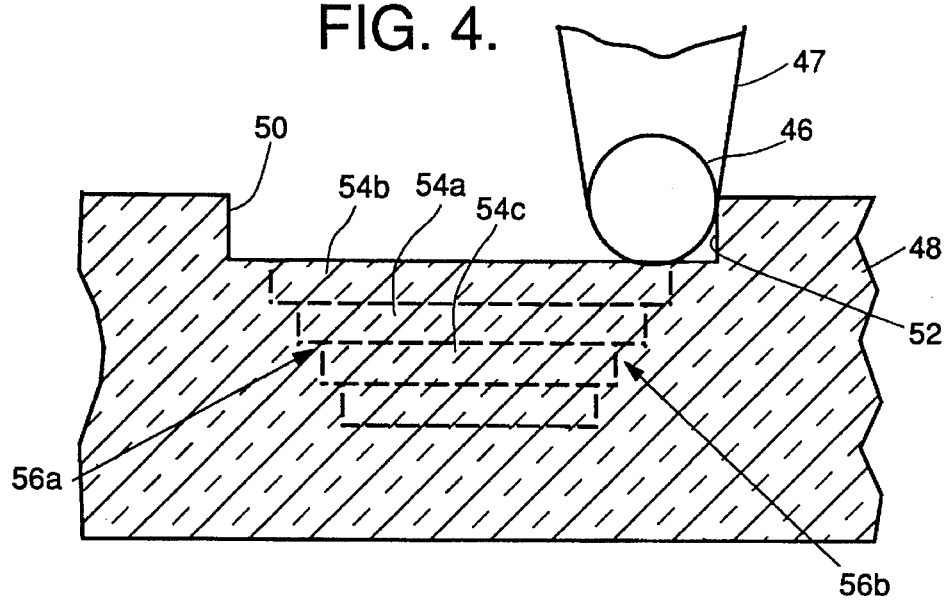
FIG. 4 is a sectional view illustrating the incremental FIB scanning used to establish a turning mirror profile with the invention.

A segment of a 3-dimensional opto-electronics system that employs the present invention to optically communicate between a pair of adjacent circuit substrates 26 and 28 is shown in FIG. 2. The lower substrate 26 includes an in-line laser 30 and a turning mirror 32 that deflects the beam from laser 30 out of the substrate's plane, while the upper substrate 28 includes an optical detector 34 that receives the beam deflected from substrate 26. The laser 30 is monolithically integrated on its substrate 26 along with laser drive circuitry 36, with metallization 38 providing a connection between the laser and its associated drive circuitry. Similarly, an amplifier circuit 40 is monolithically integrated on the upper substrate 28 along with detector 34, and is connected to the detector via metallization 42 to amplify an electrical signal that is produced by the detector in response to its receipt of a reflected laser beam.

While the detector 34 and amplifier circuitry 40 are illustrated as being formed on the underside of substrate 28 that faces the laser substrate 26, they could also be formed on the upper surface of substrate 28 if that substrate is transparent to the laser beam. For example, a laser with an InGaAs active region and InP cladding layers will emit radiation at a wavelength of approximately 1.5 microns; an InP substrate is substantially transparent to this wavelength. A third option would be to locate the detector 34 on the underside of its substrate 28 and the amplifier circuitry 40 on top of the substrate, with a conductive feedthrough electrically connecting the two. Both the driver circuitry 36 and the amplifier circuitry 40 can be connected in a conventional manner to additional circuitry that is monolithically integrated on their respective substrates. The photodetector 34 would typically be InGaAs for use with a laser having an active region of this material.

Two important features of the invention are illustrated in FIG. 2. The first is that, instead of having a flat reflecting surface that yields a diffused laser beam upon reflection, the turning mirror 32 has a compound curvature that follows curved patterns in both the x (parallel to the substrate and the axis of the laser beam) and the y (into the page of FIG. 2) directions. The curvature along both axes is preferably parabolic to focus or collimate the laser light to a small spot in both the x and y directions. By coordinating the two axes of curvature, a beam spot can be focused with a diameter of about 10–100 microns for reasonable image distances of about 1 mm or more. This allows the solid state detector 34 to be correspondingly small in size, and to thus keep its associated capacitance level very low and enable high speed operation over a large bandwidth. Although the detector 34 is illustrated in FIG. 2 for purposes of simplicity as being much greater in area than the beam spot size, in practice it should only be slightly larger than the beam spot to allow for a degree of potential misalignment between the two substrates 26 and 28.

The mirror's x-y curvature is further illustrated in FIG. 3, which is taken looking down onto the mirror. The light rays 43 emitted from the corners of the active area of laser 30 are illustrated as being reflected off the mirror surface to converge onto a small focal spot 44. Since the laser's active area is sometimes much wider (in the y direction) than it is high, the mirror's curvature in many cases may need to be different in the x and y directions. For example, making the curvature steeper (more severe) in the y direction than in the x direction will impart a smaller f number in the y direction. Thus, the image magnification and light collimation can be adjusted independently in both the x and y directions. At a particular plane in the near field, the curvatures can be adjusted as to produce a light bundle with a substantially round geometry. substantially closer to unity than the width/height ratio of the laser's beam emitting area. Due to diffraction effects that tend to blur the beam spot in the far field, different degrees of focusing or collimation in the x and y directions will be necessary to obtain a sufficiently round and small spot at other locations.

A second important feature illustrated in FIG. 2 is that the mirror 32 is spaced away from the emitting end of the laser 30 by an open area 45, and that it is illuminated by the laser beam over nearly its full height, which generally matches the height of the overall laser (typically 1–2 microns). This is in stark contrast to the prior flat mirror design of FIG. 1, in which the mirror (projected through residue 24) intersects the bottom of the laser, rather than being spaced away from the laser, and in which only the central portion of the mirror is illuminated by the laser beam. The new design allows the laser/mirror combination to be used for inter-substrate communication in a practical 3-D multi-substrate system, in which the substrates might be spaced from each other on the order of 1 mm. If the mirror 32 began right at the edge of the laser as in previous designs, diffraction effects would increase the spot size. (It should be recognized that FIG. 2 is not to scale, and that the substrates 26 and 28 would normally be spaced much further away from each other compared to the laser and mirror sizes illustrated.) By forming an intervening open area 45 between the laser and mirror, the laser beam can propagate far enough to allow it to expand and illuminate substantially the full height of the mirror, as shown in FIG. 2. Since the beam is spread out over a greater turning mirror area than in prior designs, there is a corresponding increase in its convergence angle after reflection for a given focal distance. Thus, the mirror's curvature, combined with its distance from the laser, allows it to focus the laser beam to a small, well-defined spot right at the detector on the adjacent substrate. Alternately, if the focal points in both the x and y axes are adjusted to be equal to the object distance between the laser 30 and mirror surface 32, more collimated light can be obtained due to smaller diffraction effects.

The preferred method for fabricating the turning mirror involves a three step process in which a FIB is first used to form a flat mirror surface, then to establish the desired curvature in one of the x-y directions, and finally to establish the desired curvature in the other of the x-y directions. Each of these three steps involves scanning the FIB across the mirror area of the substrate surface in raster fashion, with the length of successive scans varied to produce the desired depth differentials. This is illustrated in FIG. 4, in which the incident spot 46 from a FIB 47 is shown as having just completed a scan across the surface of a substrate 48, from a start location 50 to a finish location 52. The depth of material removed by the scan will depend upon the FIB scan time, beam energy and target current; 25 KeV and 1.0 nA would be typical values for the beam energy and target current. The shallow trench formed by the single beam scan is shown as having a floor 54a. Successive beam scans over the same area will progressively deepen the trench, as indicated by floors 54b and 54c that correspond respectively to the next two scans. A profile is developed in the end walls of the trench by varying the lengths of the successive scans. In the illustration of FIG. 4, each successive scan is slightly reduced in length at both ends from the previous scan, with a constant length differential for each successive scan. This results in staircase profiles 56a and 56b at each end, which in practice provide a good approximation of a flat wall if the increments in the scan length are kept small enough. In practice the edge walls 56a and 56b will not have the sharp corners indicated in FIG. 4, due to a tendency of the beam to smooth out sharp corners. While for optimum results the beam diameter should be substantially greater than the differential between successive scan lengths (such as a 0.1 micron scan differential for a 0.5 micron diameter beam spot), in practice a satisfactory degree of smoothness has been obtained with a 0.2 micron beam spot diameter and scan increments of 0.15 microns.

The FIB etching is preferably performed in a vacuum of $10^{-6}$ Torr or less, to assist in removing substrate material that might otherwise be redeposited on the mirror walls. An ion assisted gas etching process can also be used, in which the FIB scanning is performed in the presence of a gas such as warm methane and hydrogen, or chlorine. The surface gas creates volatile products that assist in the FIB sputtering process and can speed it up significantly and reduce redeposition effects.

Figure 5:
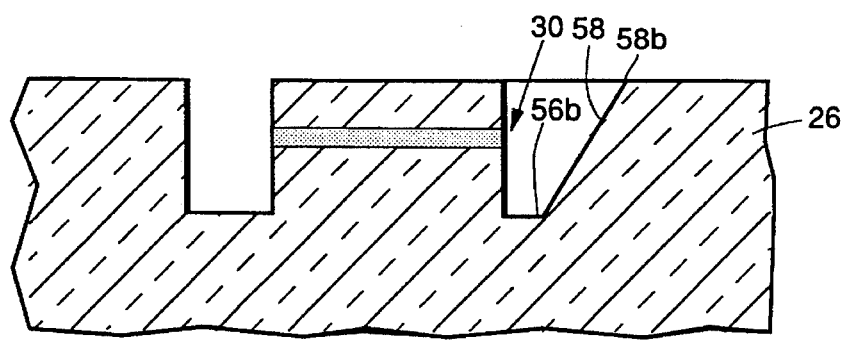
FIG. 5 is a sectional view showing an intermediate stage in the fabrication of a monolithically integrated laser and turning mirror in accordance with the invention.

The first stage of the mirror fabrication process results in a flat mirror surface 58, shown in FIG. 5, with generally vertical sidewalls. Although theoretically this flat surface would be achieved by linearly increasing the FIB dwell time from the upper end 58a of the mirror to its lower end 58b, it has been found that a modification may be necessary to avoid a residue at the lower end of the mirror, such as residue 24 in FIG. 1. While the residue 24 is of no consequence in the FIG. 1 system, since it is out of the optical path, in the preferred embodiment of the present invention, the mirror is illuminated over substantially the full laser height. To compensate for the residue, the FIB can be controlled in a manner indicated in FIG. 6, in which the FIB dwell time is initially linear down to a depth 60 at which the residue starts to appear. Thereafter the FIB dwell time increases at a faster than linear rate to remove the residue that would otherwise accumulate. The particular curvature of the dwell time-depth curve will vary according to the type of material being removed, the FIB characteristics, the mirror dimensions and angle, and the vacuum in which the fabrication is performed. An alternate approach would be to initially form the flat-walled mirror by an angled etch with a flood ion beam (with the other portions of the substrate masked), followed by the FIB to obtain the desired mirror curvature. While the angled etch approach can at present achieve a deeper mirror, it also requires additional process steps.

Figure 6:
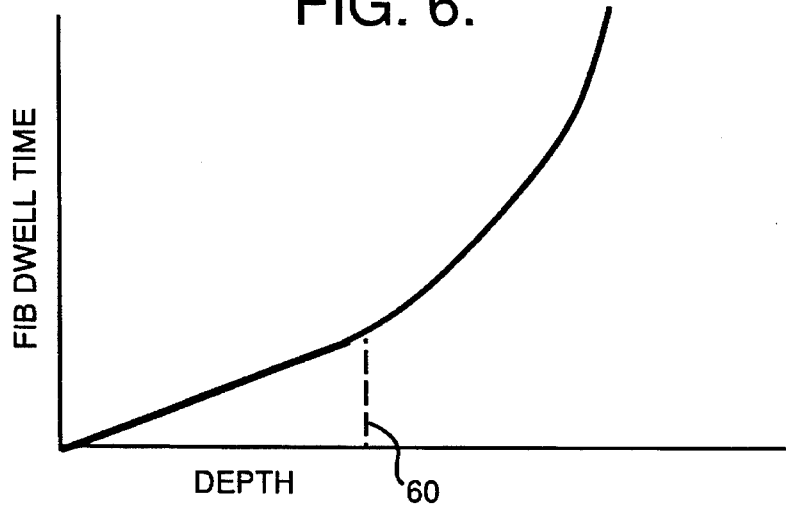
FIG. 6 is a graph illustrating the FIB dwell time characteristic used to achieve a full length turning mirror as illustrated in FIG. 5.
Figure 7A:
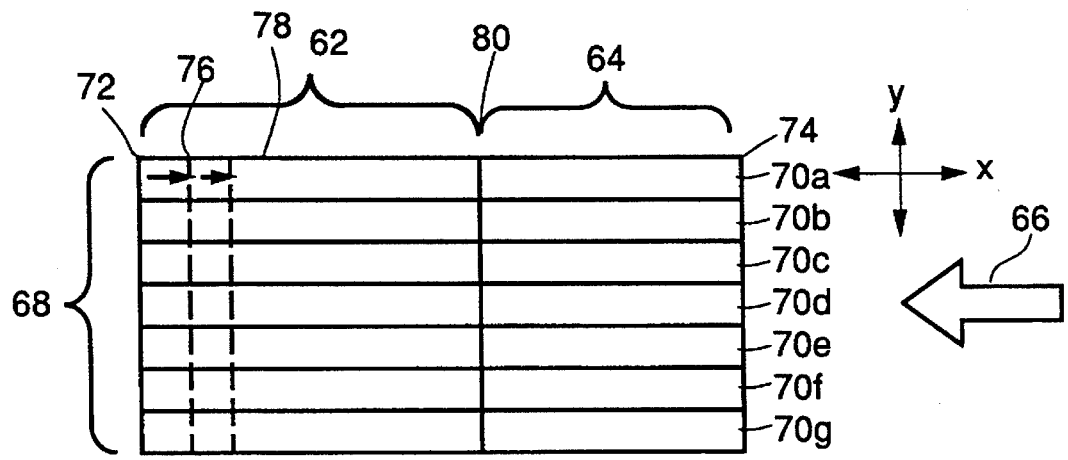
FIG. 7a, 7b and 7c are diagrams illustrating the sequential FIB scanning that is used to first produce a turning mirror with a flat surface, then to introduce a focusing curvature parallel to the beam axis, and finally to introduce a focusing curvature orthogonal to the beam axis.
Figure 7B:
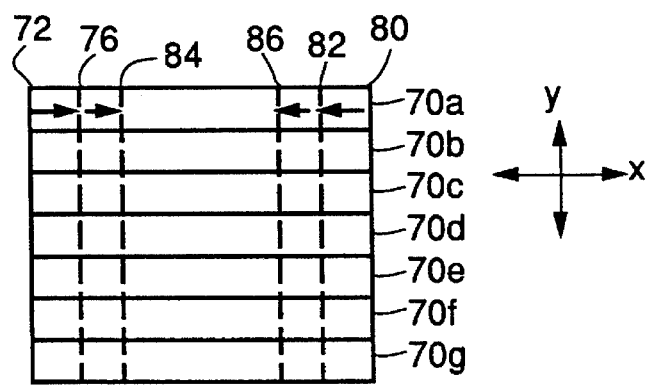
Figure 7C:
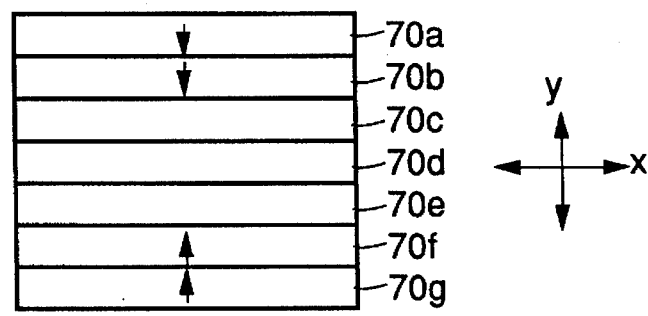

A preferred mirror fabrication sequence is illustrated in FIGS. 7a, 7b and 7c, which are taken looking down upon the mirror as in FIG. 3. In FIG. 7a the ultimate mirror dimension in the x direction is indicated by numeral 62, the gap between the mirror and laser is indicated by numeral 64, and the direction of the incoming laser beam is indicated by arrow 66. The mirror width in the y direction is indicated by numeral 68. The mirror is shown as being completely raster scanned by the FIB in seven scan lines 70a–70g, although in practice a considerably larger number of scan lines would normally be used. In the first series of scans, the FIB is moved all the way from the left end 72 of the mirror to the right end 74 of the gap for each of the scan lines 70a–70g. In the next series of scans the FIB begins at point 76, one increment to the right of the left mirror boundary 72, and again proceeds all the way to the gap's right hand edge 74 for each of the scan lines. For the third series of scans, the FIB begins at point 78, an additional increment to the right, and again proceeds all the way to the gap's right hand edge 74. In a similar fashion, the FIB's starting point is moved one increment to the right for each successive series scans. This continues until the beginning of the next FIB scan is at the boundary 80 between the mirror and gap, at which point the mirror's initial flat surface has been completed. The linear increments in FIB scan lengths are preferably adjusted as indicated in FIG. 6 (in which the FIB dwell time may be considered to be inversely proportional to the x-direction differential in the length of successive series of scans), to overcome a residue and achieve a more truly flat mirror surface. The mirror's angle to horizontal is generally proportional to the number of times the series of scans is repeated.

The next stage of the mirror fabrication, in which a curvature is added in the x direction, is illustrated in FIG. 7b. Since the FIB scans only over the mirror in this step, the gap 64 is not shown. In the first series of scans, the FIB moves over each of the scan lines 70a–70g all the way from the mirror's left hand edge 72 to its right hand edge 80. This series of scans is repeated as required to produce a relatively steep curvature at the mirror ends. In the next series of scans the scan length is reduced at both ends, so that it begins at point 76 to the right of edge 72, and ends at point 82 to the left of edge 80. The second series of scans is repeated either an equal or lesser number of times than the first series. For the next sequence of scans the scan length is again reduced at both ends, so that it commences at point 84 to the right of point 76, and ends at point 86 to the right of point 82. The third set of scans is then repeated an equal or lesser number of times than the preceding series. By gradually reducing the number of scan repeats as the scan lengths contract at each end, the mirror's curvature in the x direction becomes gradually less and less, until its slope is left essentially parallel to the original flat mirror surface towards it center. The exact mirror shape is a function of the scan length at each end of the scan lines, and the number of times each series of scans is repeated. For good focusing, the curvature preferably follows a parabola.

After forming a mirror curvature in the x direction in FIG. 7b, a curvature in the y direction is established in FIG. 7c. This sequence is arbitrary, however, and the y direction curvature can be established first if desired. Alternately, both the x and y curvatures could be established simultaneously by contracting successive series of scans in both the x and y directions.

The y curvature is established in a manner similar to the curvature in the x direction. The first series of scans is performed over the full mirror width 68, starting with scan line 70a and proceeding through each successive scan line to 70g; this series is repeated a desired number of times. The next series begins at scan line 70b and ends at scan line 70f, and is repeated the same or a fewer number of times. The third series of scans begins with scan line 70c and ends with scan line 70e, and so forth. The scan lines can be overlapped, if desired, for greater resolution.

By gradually reducing the number of times each series of scans is repeated as fewer and fewer lines are included within each successive series, a y direction curvature can be established similar to the curvature in the x direction. For a steeper y direction curvature, to provide a greater y focusing than x focusing for a rectangular beam, the number of times each series of y-curvature scans is repeated would be greater than the number of repeats for the x direction. Also, instead of continuing to scan in the x direction to establish the y-curvature, the direction of scan could simply be rotated 90° to orient the scan lines in the y direction. Scanning would then proceed by progressive shortening the scan lines for successive scan series. Another option would be to start the scanning with the minimum length scan lines, and then progressively lengthen the scans.

Once the curved mirror surface has been completed, it can be coated with a reflective material to increase its reflectivity. For example, a 45° turning mirror with an aluminum reflective film would have a reflectivity on the order of 95%, as opposed to about 30% uncoated.

In a demonstration of a mirror fabrication according to the invention, a compound curved mirror was formed with a rectangular surface area 10 microns in the x direction and 10 microns in the y direction. The FIB employed $Ga^+$ ions at room temperature with an energy of 25KeV, a target current of 1.0 nA and a spot diameter of about 0.2 microns. A flat mirror surface was initially formed in InP at an angle of 27° to the substrate surface, followed by the formation of a mirror curvature over the top 10 microns in the x direction. An extra 5 microns was milled in the x direction to prevent the test light from clipping the edge of the side wall on the opposite side of the mirror. No adjustment was necessary towards the bottom of the mirror because there was no appreciable buildup of a redeposition residue with the shallow 27° mirror angle. A 45° mirror, however, would require either additional FIB machining towards the bottom to achieve a flat surface, or an angled flood ion beam etch as described above.

To form the initial flat mirror surface, each series of scans was reduced by 0.15 microns in the x direction, with each series repeated 25 times to produce a 27° bevel. In forming the x curvature, each series of scans was reduced by 0.15 microns at each end of the scan, compared to the immediately preceding series. A total of 31 scan series were performed, with the last series having a length in the x direction of 1.0 microns. To produce a parabolic surface with a 40 micron radius of curvature, the number of repetitions for scans 1–31 was as follows:

| Scan Series | Number of Repetitions |
|---|---|
| 1,2 | 10 |
| 3–5 | 9 |
| 6–9 | 8 |
| 10–12 | 7 |
| 13–15 | 6 |
| 16–18 | 5 |
| 19–22 | 4 |
| 23–25 | 3 |
| 26–28 | 2 |
| 29–31 | 1 |

For the y direction curvature, the y increments between successive scan lines was also 0.15 microns (for a 0.2 micron diameter FIB). An additional scan line was omitted at each end in the y direction for each successive series of scans; the repetition pattern was the same as for the x direction.

Optical micrographs were taken of mirrors fabricated in this fashion, with the image plane located at 0, 10, 17, 20 and 30 microns above the surface. The results showed that the microscope light was simultaneously focused and deflected by the micro-machined mirror elements, with the location with the image plane, the amount of lateral deflection and the deflection angle geometrically consistent. The deflected beams produced the best focus at 17 microns above the surface of mirrors that had their axes positioned 27° from the surface normal, as opposed to a focal length of about 20 microns for a beam deflected from a mirror along an axis parallel to the surface normal; these results were geometrically consistent. Since the image plane for the deflected beams was not normal to the parabola axes, a small amount of image distortion was visible for these beams at their focal points. It is expected that this distortion would be correctable with a slight adjustment of the FIB scan control.

The present invention lends itself to computer automation. A Fortran 77 program that generates pixelized scan control commands for an x-curvature is disclosed in Appendix 1. The input data is defined prior to the source code. Appendix 2 is the source code for a scan subroutine used in the program of Appendix 1. An identical program could be used to control the generation of the y-curvature, with the x and y parameters simply reversed.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

APPENDIX 1

Definition of Terms

```
x start = start point of raster along x axis
y start = start point of raster along y axis
x side = length of raster in x direction
y side = length of raster in y direction
x pts = number of pixels in x direction
y lines = number of lines in y direction
nras = number of scan repetitions
delx = spacing between pixels in x direction
fac = number of pixels/µm in x direction
x end = end point of raster in x direction
y end = end point of raster in y direction
c      program parabola
```

APPENDIX 1-continued

```
c    sputters a parabola in a rectangular area
     include 'sys$library:LIOSET.FOR'
     write(5,*) 'enter retangle parameters'
     write(5,*) 'xstart,ystart,xside,yside,xpoints,
     ylines'
     write(5,*), 'where all parameters stay in 4096*4096
     scan filed'
     read(5,*) xstart,ystart,xside,yside,xpts,ylines
     write(5,99) xstart,ystart,xside,yside,xpts,ylines
     write(5,*) '-------------------------------'
     write(5,*) 'start= ',xstart,'ystart= ',ystart
     write(5,*) 'enter total pattern repeats and delx
     for parabola'
     read(5,*) nras,delx
     write(5,*) 'number of passes= ',nras,'delx= ',delx
     xend=xstart+xside
     yend=ystart+yside
     fac=xpts/xside
     write(5,*) 'send= ', xend, 'yend=',yend
     write(5,*) 'number of y lines = ',ylines
     write(5,*) 'number of x points = ',xpts,'xpts
     reduction factor=,fac
     call initscan
     nrasx=1
     dod 101 ipattern=1,nras
     xsidex=xside
     xptsx=xpts
     xstarx=xstart
     do 100 icase=1,1000
     it (icase.gt.1 ) then
     xsidex=xsidex–2.*delx
     xstarx=xstarx+delx
     xcptsx=xsidex*fac
     end if
     it (xsidex.lt.delx) goto 101
     call scan (xstart,ystart,xsidex,yside,xptsx,
     ylines, nrasx)
100  continue
101  continue
99   format(1x,6f10.2)
     stop
     end
```

APPENDIX 2

```
SUBROUTINE SCAN(xstart,ystart,xside,yside,xpts,ylines,npp)
INCLUDE 'sys$library:LIOSET.FOR'
INCLUDE 'COMMON.FOR'
INTEGER     num_points_current  !Current number of
points
REAL*4      dac_range(2)
REAL*4      x_start
REAL*4      y_start
REAL*4      x_end
REAL*4      y_end
REAL*4      y_next
REAL*4      volts_per_spacing
REAL*4      x_next
INTEGER*2   x_next_i
INTEGER*2   y_next_i
integer*2   xxoff,yyoff
INTEGER     i
INTEGER*2   x buffer(1024)     ! *2 needed !
INTEGER*4   control(3)
INTEGER     status
INTEGER     DtoA_id
INTEGER     length
DATA control / 0, 12, 1 /
DATA a / 0 /
DATA null / 0 /
DATA dac_range / –10.0 , 9.9951 /
dac_control_lines = 8
    num_points_current = xpts
! Calculate start and end coordinates for scan :
    xend=xstart+xside
    yend=ystart+yside
```

APPENDIX 2-continued

```
! ! Calculate volts/(point spacing) value :
    xvoltone=xstart*19.9551/4096.-9.995
    yvoltone=ystart*19.9551/4096.-9.995
    xvolttwo= xend*19.9551/4096.-9.995
    yvolttwo= yend*19.9551/4096.-9.995
    volts_per_spacing = abs(xvolttwo-xvoltone)/xpts
    yvolts_per_spacing = abs(yvolttwo-yvoltone)/ylines
! ! Calculate X-start :
    x_start = xvoltone
    y_start = yvoltone
    x_end = xvolttwo
    y_end= yvolttwo
! Generate and start X coordinates for one frame :
    x_next = x_start
    i = 1
    DO WHILE (( x_next .LE. x_end ) .AND. ( i .LE.
    1024))
    CALL LSP$FORMAT_TRANSLATE DAC(x_next,
    x_next_i, 1, control, dac_range)
    x_buffer(i) = x_next_i
    i = i + 1
    x_next = x_next + volts_per_spacing
    END DO
! Attach to and set up the D/A for the mapped I/O mode :
    status = LIO$ATTACH(DtoA_ID, 'AYAO',
    LIO$K_MAP)
    IF(.NOT.(status))        CALL lib$signal(%val(stat-
    us))
! ! Select trigger mode for immediate start burst mode.
! This will start the data output immediately upon execu!
    tion of a LIO$WRITE call :
    status = LIO$SET_I(DtoA_ID, LIO$K_TIRG, 1,
    LIO$K_IMM_BURST)
    IF(.NOT.(status))        Call lib$signal(%val(stat-
    us))
c   do raster
    do 999 i=1,npp
!Define first y-coordinate :
    y_next = y_start
    CALL LSP$FORMAT_TRANSLATE_DAC(y_next,
    y_next_i, 1, control, dac_range)
! Execute DO loop which output all raster points once:
    DO WHITE (y next .LE. y end)
' Output Y coordinate of first point of next line in ras
    ter:
! ! Select Y-channel :
    status = LIO$SET_I(DtoA_ID,
    LIO$K_DA_CHAN, 1, 1)
    IF(.NOT.(status))    CALL lib$signal(%val(status))
! ! Output Y coordinate:
    status = LIO$WRITE(DtoA_ID, y_nest_i, 2, dac_con-
    trol_lines)
    IF(.NOT.(status))        CALL lib$signal(%val(stat-
    us))
! Output all X coordinates of X-line:
! ! Select x-channel of D/A :
    status = LIO$SET_I(DtoA_ID,
    LIO$K_DA_CHAN, 1,0)
    IF(.NOT.(status))    CALL lib$signal(%val(status))
! ! Output all x-line of data to x-channel of D/A :
    length = 2*(num_points_current)
c   write(25,*) 'dtOa_id,dac_1 length',dtoa_id,
    dac_control_lines,length
c   write(25,88) (x_buffer(i),i=1,200)
 88 format(1x,10o6)
c   if(length.ne.0) call exit
    status = LIO$WRITE(DtoA_ID, x_buffer, length
    dac_control_lines)
    IF(.NOT.(status))
! ! Calculate next y-coordinate :
    y_next = y_next + yvolt_per_spacing
    CALL LSP$FORMAT_TRANSLATE_DAC(y_next,
    y_next_i, 1, control, dac_range)
! ! Loop back to output next y D/A value and next x "line"
    provided the "y_end" value has not been exceeded :
    END DO
999 continue
!-----------------------------------------
! Exit from subroutine :
```

APPENDIX 2-continued

```
700 CONTINUE
! ! Detach from D/A :
    status = LIO$DETACH(DtoA_ID, )
    IF (.NOT.(status))    CALL lib$signal($val(status)
    return
    end
```

We claim:

1. A method of forming a 3-dimensional mirror having a desired curvature, in an x-direction and a y-direction, for use in an opto-electronic system in-line with a laser on a substrate to redirect and restrict the expansion of a beam from said laser, comprising the steps of:

forming a substantially flat-walled mirror in the substrate in-line with the laser, and raster scanning said flat-walled mirror with a focused ion beam (FIB) to obtain said desired curvature in both x- and y-directions so that said mirror both deflects and focuses said beam from said laser away from said substrate.

2. The method of claim 1, wherein said flat-walled mirror is formed by raster scanning a mirror area of said substrate with a FIB.

3. The method of claim 2, wherein said substantially flat-walled mirror is formed to a depth approximately equal to the height of said laser, and the FIB dose is increased towards the bottom of said mirror in a greater than unity proportion to the mirror depth to obtain said flat walls.

4. The method of claim 2, wherein said substantially flat-walled mirror is formed to a depth approximately equal to the height of said laser.

5. The method of claim 2, wherein said mirror is formed with a generally parabolic curvature and oriented to redirect said laser beam in a direction generally normal to the substrate.

6. The method of claim 2, wherein said laser emits a laser beam from an emitting surface that is substantially wider than it is high, and said mirror is formed with a different curvature along its width than along its height to form said laser beam to a spot that is smaller than the spot size resulting from a flat mirror, and that has a width/height ratio substantially closer to unity than the width/height ratio of said laser emitting surface.

7. The method of claim 2, wherein said mirror is spaced away from said laser by removing intervening substrate material, and is formed with a curvature that extends substantially the full laser height from the substrate, and wherein said mirror-laser spacing is selected to allow said laser beam to expand over a larger mirror surface, and thereby reduce diffraction effects from the mirror surface.

8. The method of claim 2, wherein said mirror curvature is established by raster scanning said mirror area in multiple series of FIB raster scans, with each series encompassing a different proportion of the mirror surface, and repeating each series a number of times that generally increases with the area covered by the series.

9. The method of claim 8, wherein said scanning is conducted along generally orthogonal x-y axes, one set of said scan series is characterized by a substantially constant y-dimension and a progressively reduced x-dimension, and another set of said scan series is characterized by a substantially constant x-dimension and a progressively reduced y-dimension.

* * * * *